United States Patent
Kong et al.

(10) Patent No.: US 12,376,303 B2
(45) Date of Patent: Jul. 29, 2025

(54) ELECTRONIC DEVICES INCLUDING A SOURCE SEAL, AND RELATED METHODS AND ELECTRONIC SYSTEMS

(71) Applicant: Micron Technology, Inc., Boise, ID (US)

(72) Inventors: Lingyu Kong, Singapore (SG); Sok Han Wong, Singapore (SG)

(73) Assignee: Micron Technology, Inc., Boise, ID (US)

( * ) Notice: Subject to any disclaimer, the term of this patent is extended or adjusted under 35 U.S.C. 154(b) by 445 days.

(21) Appl. No.: 17/807,074

(22) Filed: Jun. 15, 2022

(65) Prior Publication Data

US 2023/0413550 A1   Dec. 21, 2023

(51) Int. Cl.
*H10B 41/27*  (2023.01)
*H10B 43/27*  (2023.01)
*H01L 21/311*  (2006.01)

(52) U.S. Cl.
CPC .......... *H10B 43/27* (2023.02); *H10B 41/27* (2023.02); *H01L 21/31111* (2013.01)

(58) Field of Classification Search
CPC ........ H10B 43/27; H10B 41/27; H10B 43/10; H01L 21/31111; H01L 21/31116; H01L 21/31122
See application file for complete search history.

(56) References Cited

U.S. PATENT DOCUMENTS

| | | | |
|---|---|---|---|
| 9,741,737 B1 | 8/2017 | Huang et al. | |
| 2016/0293621 A1* | 10/2016 | Huang | H10B 43/35 |
| 2018/0122906 A1 | 5/2018 | Yu et al. | |
| 2021/0358938 A1 | 11/2021 | Hopkins | |
| 2021/0358939 A1 | 11/2021 | Hopkins et al. | |
| 2021/0375903 A1 | 12/2021 | Hopkins | |
| 2021/0376083 A1 | 12/2021 | Greenlee et al. | |
| 2021/0384208 A1 | 12/2021 | Hopkins et al. | |
| 2021/0384216 A1 | 12/2021 | Greenlee et al. | |

OTHER PUBLICATIONS

Hopkins et al., Integrated Assemblies, and Methods of Forming Integrated Assemblies, filed Dec. 18, 2020, U.S. Appl. No. 17/126,777, 66 pages.
Hopkins et al., Methods of Forming Microelectronic Devices, and Related Microelectronic Devices, Memory Devices, and Electronic Systems, file Sep. 4, 2020, U.S. Appl. No. 17/012,741, 46 pages.
Hopkins et al., Microelectronic Devices Including Cap Structures, and Related Electronic Systems and Methods, filed Dec. 27, 2021, U.S. Appl. No. 63/266,027, 71 pages.

(Continued)

*Primary Examiner* — Elias Ullah
(74) *Attorney, Agent, or Firm* — TraskBritt

(57) ABSTRACT

An electronic device comprises a source stack comprising one or more conductive materials. A source contact is adjacent to the source stack and a source seal is on a portion of the source contact. Tiers of alternating conductive materials and dielectric materials are adjacent to the source contact. Pillars extend through the tiers and the source contact and into the source stack. Additional electronic devices, electronic systems, and methods of forming the electronic devices are disclosed.

20 Claims, 12 Drawing Sheets

(56) References Cited

OTHER PUBLICATIONS

Howder et al., Microelectronic Devices Including Filled Slits and Memory Cell Pillars, and Related Memory Devices, Electronic Systems, and Methods, filed Apr. 16, 2021, U.S. Appl. No. 17/233,158, 46 pages.

Lindemann et al., Electronic Devices Comprising a Dielectric Material, and Related Systems and Methods, filed Jan. 26, 2021, U.S. Appl. No. 17/158,918, 55 pages.

Liu et al., Microelectronic Devices with Vertically Recessed Channel Structures and Discrete, Spaced Inter-Slit Structures, and Related Methods and Systems, filed Jan. 26, 2021, U.S. Appl. No. 17/158,888, 92 pages.

* cited by examiner

ELECTRONIC DEVICES INCLUDING A SOURCE SEAL, AND RELATED METHODS AND ELECTRONIC SYSTEMS

TECHNICAL FIELD

Embodiments of the disclosure relate to the field of electronic device design and fabrication. More particularly, the disclosure relates to electronic devices having a seal (e.g., a source seal, a protective seal) on a source contact, to related electronic systems, and to methods for forming the electronic devices.

BACKGROUND

Memory devices provide data storage for electronic systems. A Flash memory device is one of various memory device types and has numerous uses in modern computers and other electrical devices. A conventional Flash memory device may include a memory array that has a large number of charge storage devices (e.g., memory cells, such as non-volatile memory cells) arranged in rows and columns. In a NAND architecture type of Flash memory, memory cells arranged in a column are coupled in series, and a first memory cell of the column is coupled to a data line (e.g., a bit line). In a three-dimensional (3D) NAND memory device, not only are the memory cells arranged in rows and columns in a horizontal array, but tiers of the horizontal arrays are stacked over one another (e.g., as vertical strings of memory cells) to provide a 3D array of the memory cells. The stack of tiers vertically alternate conductive materials with dielectric materials, with the conductive materials functioning as access lines (e.g., word lines) and gate structures (e.g., control gates) for the memory cells. Pillars comprising channels and tunneling structures extend along and form portions of the memory cells of individual vertical strings of memory cells. A drain end of a string is adjacent one of the top or bottom of the pillar, while a source end of the string is adjacent the other of the top or bottom of the pillar. The drain end is operably connected to a bit line, and the source end is operably connected to a source line. A 3D NAND memory device also includes electrical connections between, e.g., access lines (e.g., word lines) and other conductive structures of the device so that the memory cells of the vertical strings can be selected for writing, reading, and erasing operations.

To form the 3D NAND memory device by a so-called "replacement gate" process, an etch act is conducted to remove a nitride material in tiers of the 3D NAND memory device and a conductive material is formed in the openings previously occupied by the nitride material. However, the etch chemistry used in the replacement gate process may damage polysilicon materials and other materials present in the 3D NAND memory device. Oxidation oxides, silicides, and nitrides have been used to prevent the damage during fabrication of the 3D NAND memory device. The damaged materials may lead to block collapse of the 3D NAND memory device.

DETAILED DESCRIPTION

Figure 1A:
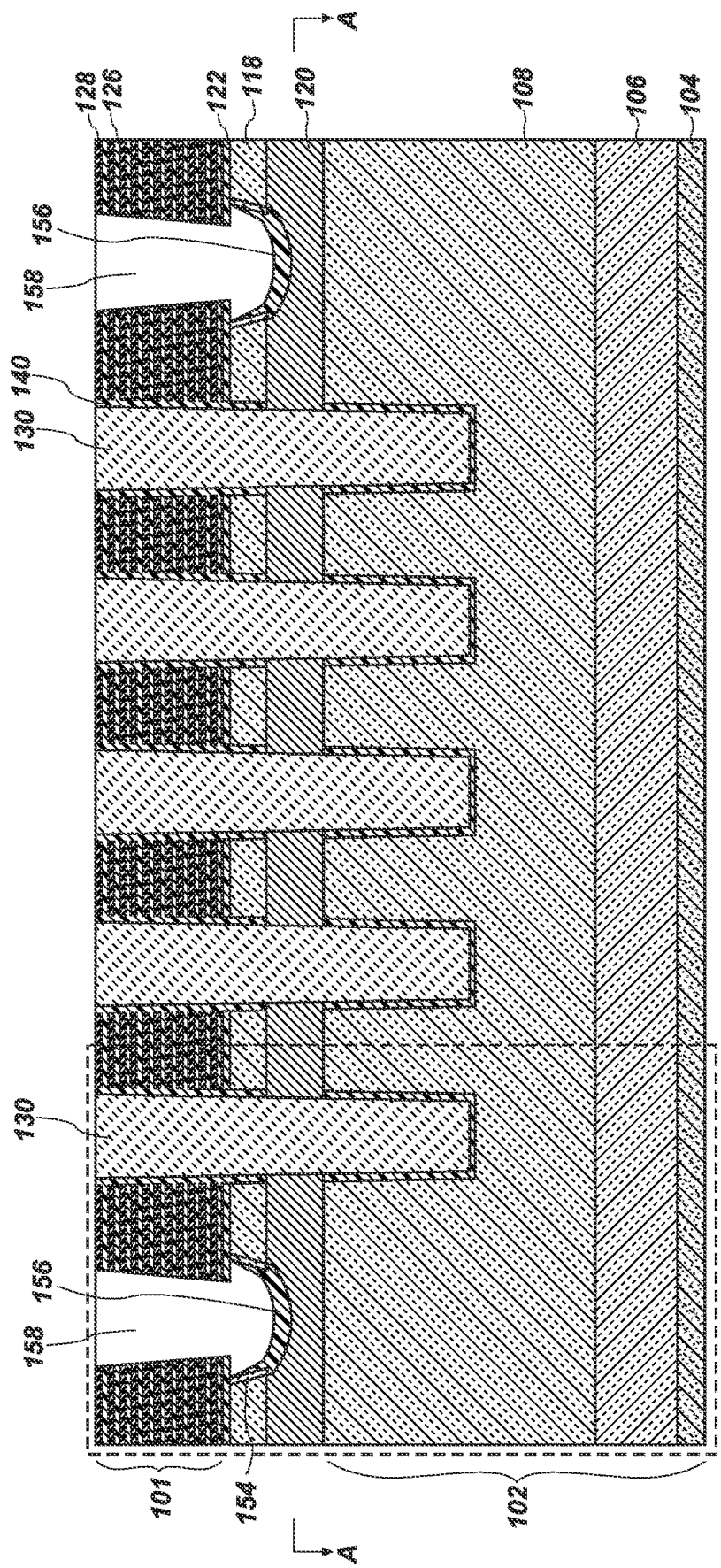
FIGS. 1A and 1B are cross-sectional views of an electronic device in accordance with embodiments of the disclosure, with FIG. 1B being an enlarged view of a portion of the electronic device of FIG. 1A.

Electronic devices (e.g., apparatus, microelectronic devices) and systems (e.g., electronic systems) according to embodiments of the disclosure include a source seal (e.g., a source liner) between a source contact and tiers of alternating dielectric materials and conductive materials of the electronic devices. The source contact extends laterally and contacts a channel of pillars (e.g., memory pillars) of the electronic device. The source seal separates the source contact from the tiers and functions as a protective material (e.g., a plug) over the source contact. The source seal may be formed by a so-called "bottom-up" conformal deposition process, such as a bottom-up atomic layer deposition (ALD) process. The source seal extends laterally over a portion of the source contact and protects the source contact during subsequently conducted process acts that may damage the source contact. The source seal reduces or eliminates damage to the source contact and other materials underlying the source seal during removal of a liner (e.g., a tier sidewall liner) on the tiers. The tier sidewall liner may be substantially removed (e.g., substantially completely removed) during fabrication of the electronic device without removing a portion of, or otherwise damaging, the source contact. In comparison to conventional electronic devices that lack the source seal, block collapse is reduced or eliminated in the electronic device including the source seal according to embodiments of the disclosure.

The following description provides specific details, such as material types, material thicknesses, and process conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of an electronic device or a complete process flow for manufacturing the electronic device and the structures described below do not form a complete electronic device. Only those process acts and structures necessary to understand the embodiments described herein are described in detail below. Additional acts to form a complete electronic device may be performed by conventional techniques. Accordingly, only the methods and structures necessary to understand embodiments of the electronic device (e.g., electronic devices, systems, apparatuses) and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Alternatively, the materials may be grown in situ. Depending on the specific material to be formed, the technique for depositing or growing the material may be selected by a person of ordinary skill in the art unless the context indicates otherwise. The removal of materials may be accomplished by any suitable technique including, but not limited to, etching (e.g., dry etching, wet etching, vapor etching), ion milling, abrasive planarization (e.g., chemical-mechanical planarization), or other known methods unless the context indicates otherwise.

Drawings presented herein are for illustrative purposes only, and are not meant to be actual views of any particular material, component, structure, electronic device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "and/or" includes any and all combinations of one or more of the associated listed items.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the terms "comprising," "including," "containing," "characterized by," and grammatical equivalents thereof are inclusive or open-ended terms that do not exclude additional, unrecited elements or method steps, but also include the more restrictive terms "consisting of" and "consisting essentially of" and grammatical equivalents thereof.

As used herein, the term "conductive material" means and includes an electrically conductive material. The conductive material may include, but is not limited to, one or more of a doped polysilicon, undoped polysilicon, a metal, an alloy, a conductive metal oxide, a conductive metal nitride, a conductive metal silicide, and a conductively doped semiconductor material. By way of example only, the conductive material may be one or more of tungsten (W), tungsten nitride ($WN_y$), nickel (Ni), tantalum (Ta), tantalum nitride ($TaN_y$), tantalum silicide ($TaSi_x$), platinum (Pt), copper (Cu), silver (Ag), gold (Au), aluminum (Al), molybdenum (Mo), titanium (Ti), titanium nitride ($TiN_y$), titanium silicide ($TiSi_x$), titanium silicon nitride ($TiSi_xN_y$), titanium aluminum nitride ($TiAl_xN_y$), molybdenum nitride ($MoN_x$), iridium (Ir), iridium oxide ($IrO_z$), ruthenium (Ru), ruthenium oxide ($RuO_z$), n-doped polysilicon, p-doped polysilicon, undoped polysilicon, and conductively doped silicon, where x, y, or z are integers or non-integers.

As used herein, the term "configured" refers to a size, shape, material composition, and arrangement of one or more of at least one structure and at least one apparatus facilitating operation of one or more of the structure and the apparatus in a pre-determined way.

As used herein, the phrase "coupled to" refers to structures operably connected with each other, such as electrically connected through a direct ohmic connection or through an indirect connection (e.g., via another structure).

As used herein, the term "dielectric material" means and includes an electrically insulative material. The dielectric material may include, but is not limited to, one or more of an insulative oxide material, an insulative nitride material, an insulative oxynitride material, an insulative carboxynitride material, and/or air. A dielectric oxide material may be an oxide material, a metal oxide material, or a combination thereof. The dielectric oxide material may include, but is not limited to, a silicon oxide ($SiO_x$, silicon dioxide ($SiO_2$)), phosphosilicate glass (PSG), borosilicate glass (BSG), borophosphosilicate glass (BPSG), fluorosilicate glass (FSG), aluminum oxide ($AlO_x$), barium oxide, gadolinium oxide ($GdO_x$), hafnium oxide ($HfO_x$), magnesium oxide ($MgO_x$), molybdenum oxide, niobium oxide ($NbO_x$), strontium oxide, tantalum oxide ($TaO_x$), titanium oxide ($TiO_x$), yttrium oxide, zirconium oxide ($ZrO_x$), hafnium silicate, a dielectric oxynitride material (e.g., $SiO_xN_y$), a dielectric carbon nitride material (SiCN), a dielectric carboxynitride material (e.g., $SiO_xC_zN_y$), a combination thereof, or a combination of one or more of the listed materials with silicon oxide, where values of "x," "y," and "z" may be integers or may be non-integers. A dielectric nitride material may include, but is not limited to, silicon nitride. A dielectric oxynitride material may include, but is not limited to, a silicon oxynitride ($SiO_xN_y$). A dielectric carboxynitride material may include, but is not limited to, a silicon carboxynitride ($SiO_xC_zN_y$). The dielectric material may be a stoichiometric compound or a non-stoichiometric compound.

As used herein, the term "electronic device" includes, without limitation, a memory device, as well as semiconductor devices which may or may not incorporate memory, such as a logic device, a processor device, or a radiofrequency (RF) device. Further, an electronic device may incorporate memory in addition to other functions such as, for example, a so-called "system on a chip" (SoC) including a processor and memory, or an electronic device including logic and memory. The electronic device may, for example, be a 3D electronic device, such as a 3D NAND Flash memory device.

As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be excluded.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, no intervening elements are present.

As used herein, the terms "opening" and "slit" mean and include a volume extending through at least one structure or at least one material, leaving a void (e.g., gap) in that at least one structure or at least one material, or a volume extending between structures or materials, leaving a gap between the structures or materials. Unless otherwise described, an "opening" and/or "slit" is not necessarily empty of material. That is, an "opening" and/or "slit" is not necessarily void space. An "opening" and/or "slit" formed in or between structures or materials may comprise structure(s) or material(s) other than that in or between which the opening is formed. And, structure(s) or material(s) "exposed" within an "opening" and/or "slit" is (are) not necessarily in contact with an atmosphere or non-solid environment. Structure(s) or material(s) "exposed" within an "opening" and/or "slit" may be adjacent or in contact with other structure(s) or material(s) that is (are) disposed within the "opening" and/or "slit."

As used herein, the term "sacrificial," when used in reference to a material or a structure, means and includes a material or structure that is formed during a fabrication process but at least a portion of which is removed (e.g., substantially removed) prior to completion of the fabrication process. The sacrificial material or sacrificial structure may be present in some portions of the electronic device and absent in other portions of the electronic device.

As used herein, the terms "selectively removable" or "selectively etchable" mean and include a material that exhibits a greater etch rate responsive to exposure to a given etch chemistry and/or process conditions (collectively referred to as etch conditions) relative to another material exposed to the same etch chemistry and/or process conditions. For example, the material may exhibit an etch rate that is at least about five times greater than the etch rate of another material, such as an etch rate of about ten times greater, about twenty times greater, or about forty times greater than the etch rate of the another material. Etch chemistries and process conditions for selectively etching a desired material may be selected by a person of ordinary skill in the art.

As used herein, the term "source seal" means and includes a material that is in contact (e.g., direct contact) with a portion of a source contact of the electronic device and protects the source contact from damage caused by subsequently conducted process acts used to form the electronic device.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "substrate" means and includes a material (e.g., a base material) or construction upon which additional materials or components, such as those within memory cells, are formed. The substrate may be an electronic substrate, a semiconductor substrate, a base semiconductor layer on a supporting structure, an electrode, an electronic substrate having one or more materials, layers, structures, or regions formed thereon, or a semiconductor substrate having one or more materials, layers, structures, or regions formed thereon. The materials on the electronic substrate or semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. Furthermore, when reference is made to a "substrate" or "base material" in the following description, previous process acts may have been conducted to form materials or structures in or on the substrate or base material.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

Figure 1B:
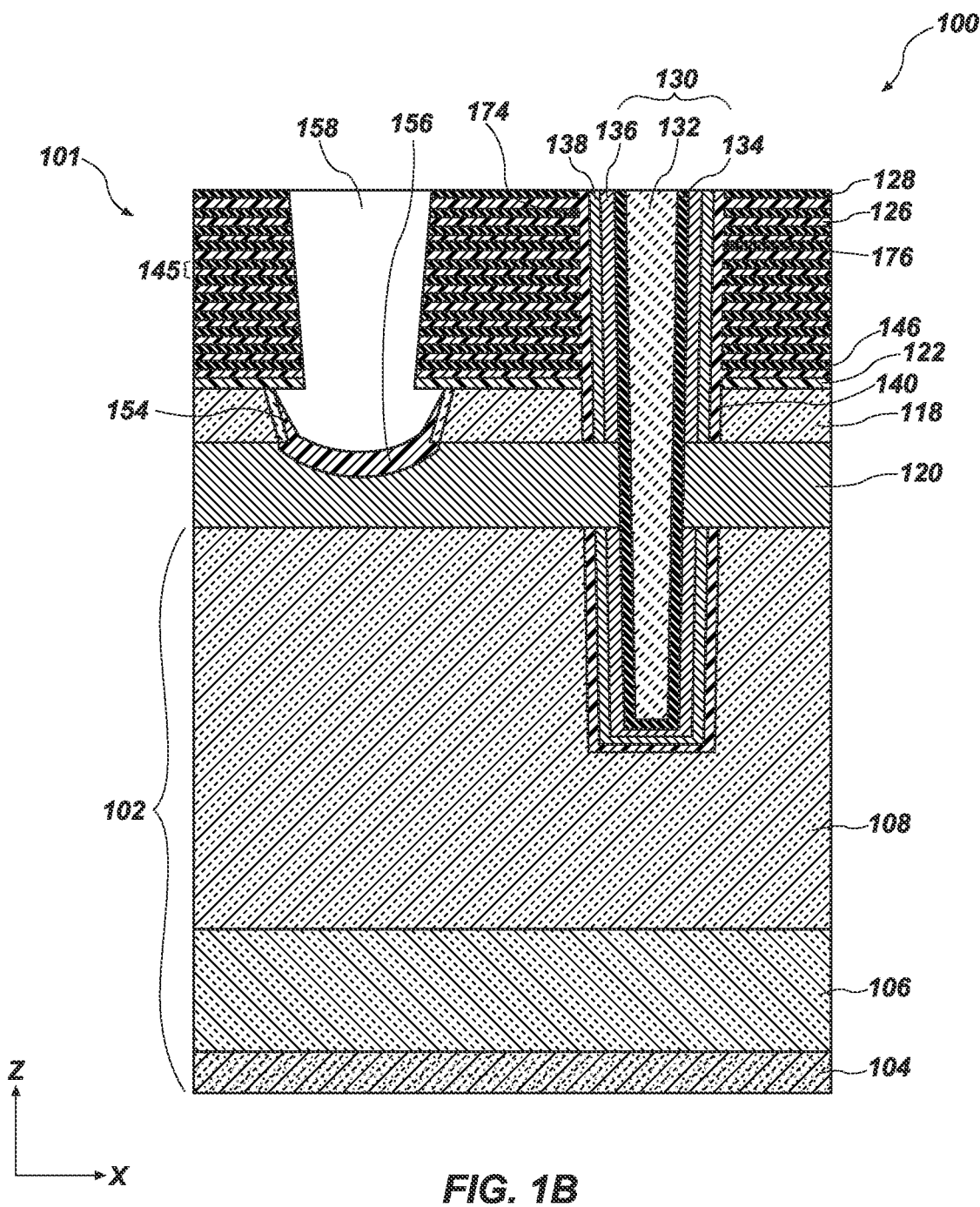
Figure 1C:
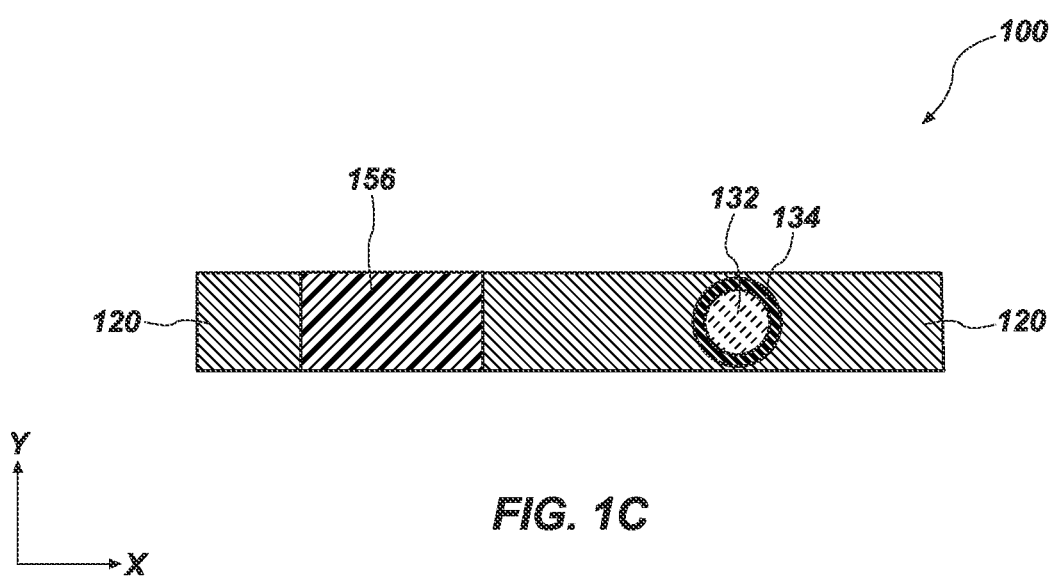
FIG. 1C is a top-down view of the electronic device of FIG. 1B taken along the A-A line.

An electronic device 100 according to embodiments of the disclosure is shown in FIGS. 1A-1C. The electronic device 100 includes a source stack 102 that includes one or more conductive materials, such as a conductive material 104, a source material 106, and a doped semiconductive material 108. The conductive material 104 may be a conductive liner material and is adjacent to (e.g., on, vertically adjacent to) a base material (not shown). The source material 106 is adjacent to (e.g., on, vertically adjacent to) the conductive material 104, and the doped semiconductive material 108 is adjacent to (e.g., on, vertically adjacent to) the source material 106. By way of example only, the conductive material 104 may be formed of titanium nitride, the source material 106 may be formed of tungsten silicide, and the doped semiconductive material 108 may be formed of a doped polysilicon. A source contact 120 is adjacent to (e.g., on, vertically adjacent to) the source stack 102 and provides lateral access to pillars 130. The source contact 120 may be formed of a conductive material, such as a doped polysilicon. A doped dielectric material 118 is adjacent to (e.g., on, vertically adjacent to) the source stack 102. The dielectric materials 126 are adjacent to (e.g., on, vertically adjacent to) the source contact 120. A material of the doped dielectric material 118 is selected to be selectively removable under some etch conditions and to be resistant to removal under other etch conditions. The doped dielectric material 118 may be formed of a doped polysilicon. A dielectric cap material 122 is adjacent to (e.g., on, vertically adjacent to) the doped dielectric material 118. The dielectric cap material 122 may be formed of $SiO_x$.

Tiers 145 of alternating dielectric materials 126 and conductive materials 128 may be formed of $SiO_x$ and the conductive materials 128 may be formed of tungsten. Some of the conductive materials 128 of the tiers 145 are configured as so-called "replacement gate" word lines (e.g., word lines formed by the replacement gate or "gate late" process). Other conductive materials 128, such as one or more of the lowermost conductive materials 128, are configured as select gate sources (SGSs) 146 and one or more of the uppermost conductive materials 128 are configured as select gate drains (SGDs). For instance, the one or more conductive materials 128 proximal to the source contact 120 may function as the one or more SGSs 146 and the one or more conductive materials 128 distal to the source contact 120 may function as the one or more SGDs. The tiers 145 form a tier stack 101 adjacent to (e.g., on, vertically adjacent to) the source stack 102, with the source contact 120 laterally separating the tier stack 101 and the source stack 102. The doped dielectric material 118 and the dielectric cap material 122 laterally separate the tier stack 101 from the source contact 120.

The pillars 130 (e.g., memory pillars) extend through the tiers 145, the dielectric cap material 122, the doped dielectric material 118, the source contact 120, and at least partially into the doped semiconductive material 108. While FIG. 1A illustrates the pillars 130 as a single material for convenience, multiple materials may be present, as shown in FIGS. 1B and 1C. The materials of the pillar 130 may be configured and formulated to form memory cells 176 following subsequent processing of the electronic device 100. Cell films of the pillars 130 include a channel 134, a tunnel dielectric material 136, a charge trap material 138, and a charge blocking material 140, which function as tunneling structures of the pillars 130 of the electronic device 100. The pillars 130 also include a fill material 132. The source contact 120 is electrically connected to the pillars 130, with the source contact 120 contacting (e.g., directly contacting) the channel 134, the tunnel dielectric material 136, the charge trap material 138, and the charge blocking material 140 of the pillars 130. The conductive materials 128 may form strings 174 of the memory cells 176, with individual memory cells 176 located at intersections of the cell films of the pillars 130 and the conductive materials 128 of the tiers 145. The memory cells 176 are laterally adjacent to the conductive materials 166 of the tiers 145.

The charge blocking material 140 may be formed of and include a dielectric material. By way of example only, the charge blocking material 140 may be one or more of an oxide (e.g., silicon dioxide), a nitride (silicon nitride), and an oxynitride (silicon oxynitride), or another material. In some embodiments, the charge blocking material 140 is silicon dioxide.

The charge trap material 138 may be formed of and include at least one memory material and/or one or more conductive materials. The charge trap material 138 may be formed of and include one or more of silicon nitride, silicon oxynitride, polysilicon (doped polysilicon), a conductive material (e.g., tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), a semiconductive material (e.g., polycrystalline or amorphous semiconductor material, including at least one elemental semiconductor element and/or including at least one compound semiconductor material, such as conductive nanoparticles (e.g., ruthenium nanoparticles) and/or metal dots). In some embodiments, the charge trap material 138 is silicon nitride.

The tunnel dielectric material 136 may include one or more dielectric materials, such as one or more of a silicon nitride material or a silicon oxide material. In some embodiments, the tunnel dielectric material 136 is a so-called "ONO" structure that includes silicon dioxide, silicon nitride, and silicon dioxide.

The channel 134 may be formed of and include a semiconductive material, a non-silicon channel material, or other channel material. The material of the channel may include, but is not limited to, a polysilicon material (e.g., polycrystalline silicon), a III-V compound semiconductive material, a II-VI compound semiconductive material, an organic semiconductive material, GaAs, InP, GaP, GaN, an oxide semiconductive material, or a combination thereof. In some embodiments, the channel 134 is polysilicon, such as a doped polysilicon. The channel 134 may be configured as a so-called doped hollow channel (DHC) or other configuration. The fill material 132 may be a dielectric material, such as silicon dioxide.

A source seal 156 (e.g., a source liner 156) is adjacent to (e.g., on, laterally adjacent to) the pillars 130. The source seal 156 is positioned between the source contact 120 and a fill material 158 in a slit 266 (see FIG. 2) of the electronic device 100. The source seal 156 is recessed in a portion of the source contact 120 below the slit fill material 158 in the slit 266. The source seal 156 separates the source contact 120 from the tiers 145 and protects underlying portions of the source contact 120 during fabrication of the electronic device 100. The source seal 156 extends substantially continuously over a recessed surface (e.g., a recessed portion) of the source contact 120, and also on sidewalls of a slit liner 154 or, alternatively, on sidewalls of the doped dielectric material 118. The source seal 156 prevents removal of the source contact 120 and other materials underlying the source seal 156 during removal of other materials of the electronic device 100. As shown in FIG. 1C, which is a top down view taken along the A-A line of FIG. 1B, the source seal 156 is separated from the pillars 130 by the source contact 120. The source seal 156 may be formed from a material that is resistant to removal conditions (e.g., etch conditions) used to remove nitride materials 260 of tiers 262 (see FIG. 2). In other words, the nitride materials 260 of tiers 262 may be selectively etchable relative to the source seal 156. The source seal 156 may be a metal material or a dielectric material, such as a dielectric oxide material. By way of example only, the source seal 156 may be formed of a silicon oxide, silicon oxynitride, aluminum oxide, or hafnium oxide.

The slit liner 154 is, optionally, adjacent to (e.g., laterally adjacent to) the doped dielectric material 118. For instance, the slit liner 154 is on sidewalls of the doped dielectric material 118. The slit liner 154 may be a dielectric material including, but not limited to, a silicon oxide, a silicon nitride, silicon oxynitride, aluminum oxide, or hafnium oxide. The slit liner 154 and the source seal 156 may be formed of the same material composition or a different material composition. The slit liner 154 (if present) and the source seal 156, in combination, form a substantially continuous liner over the sidewalls of the doped dielectric material 118 and the recessed surface of the source contact 120. Since the source seal 156 is recessed in the source contact 120, an upper surface of the source seal 156 may not be coplanar with the upper surface of the source contact 120. Alternatively, the slit liner 154 is not present on the sidewalls of the doped dielectric material 118 and the source seal 156 is in direct contact with the doped dielectric material 118 (see FIG. 6B). A slit fill material 158 is adjacent to (e.g., vertically adjacent to) the source seal 156 and extends in a vertical direction from the source seal 156 to an upper surface of the tiers 145. The slit fill material 158 extends in a lateral direction between opposing portions of the slit liner 154 and opposing portions of the tiers 145. The slit fill material 158 substantially fills the slit 266. The substantially continuous liner including the slit liner 154 and the source seal 156 protects surrounding materials from etch conditions used during fabrication of the electronic device 100.

Accordingly, in some embodiments, an electronic device comprises a source stack comprising one or more conductive materials. A source contact is adjacent to the source stack and a source seal is on a portion of the source contact. Tiers of alternating conductive materials and dielectric materials are adjacent to the source contact. Pillars extend through the tiers and the source contact and into the source stack.

Accordingly, in other embodiments, an electronic device comprises a source stack adjacent to a source contact. A tier stack comprising conductive materials and dielectric materials is adjacent to the source stack. A source seal is on a recessed portion of the source contact. The source seal is configured as a continuous material on the recessed portion of the source contact. Pillars extend through the tier stack and the source contact and into the source stack.

The electronic device 100 according to embodiments of the disclosure may be formed from electronic device structures 100' as shown in FIGS. 2-6. The electronic device structures 100' in FIGS. 2-6B illustrate method acts conducted prior to the formation of the electronic device 100 of FIG. 1. During the fabrication of the electronic device 100, multiple polysilicon materials, such as undoped polysilicon materials and/or doped polysilicon materials, may be present. For instance, the doped semiconductive material 108, the doped dielectric material 118, the source contact 120, and a tier liner 264 (see FIG. 2), among others, may be formed from polysilicon materials. The polysilicon materials may be doped with one or more dopants, such as boron, carbon, oxygen, nitrogen, or gallium, to provide etch selectivity. The implant conditions and the dopant concentration may be tailored to achieve the desired etch selectivity of the polysilicon materials relative to the source seal 156. The source seal 156 may be substantially resistant to etch chemistries used to selectively remove polysilicon materials, such as tetramethylammonium hydroxide (TMAH)-based chemistry or other etch chemistries (e.g., phosphoric acid-based etch chemistries, ammonium hydroxide, or halogen-based etch chemistries).

Figure 2:
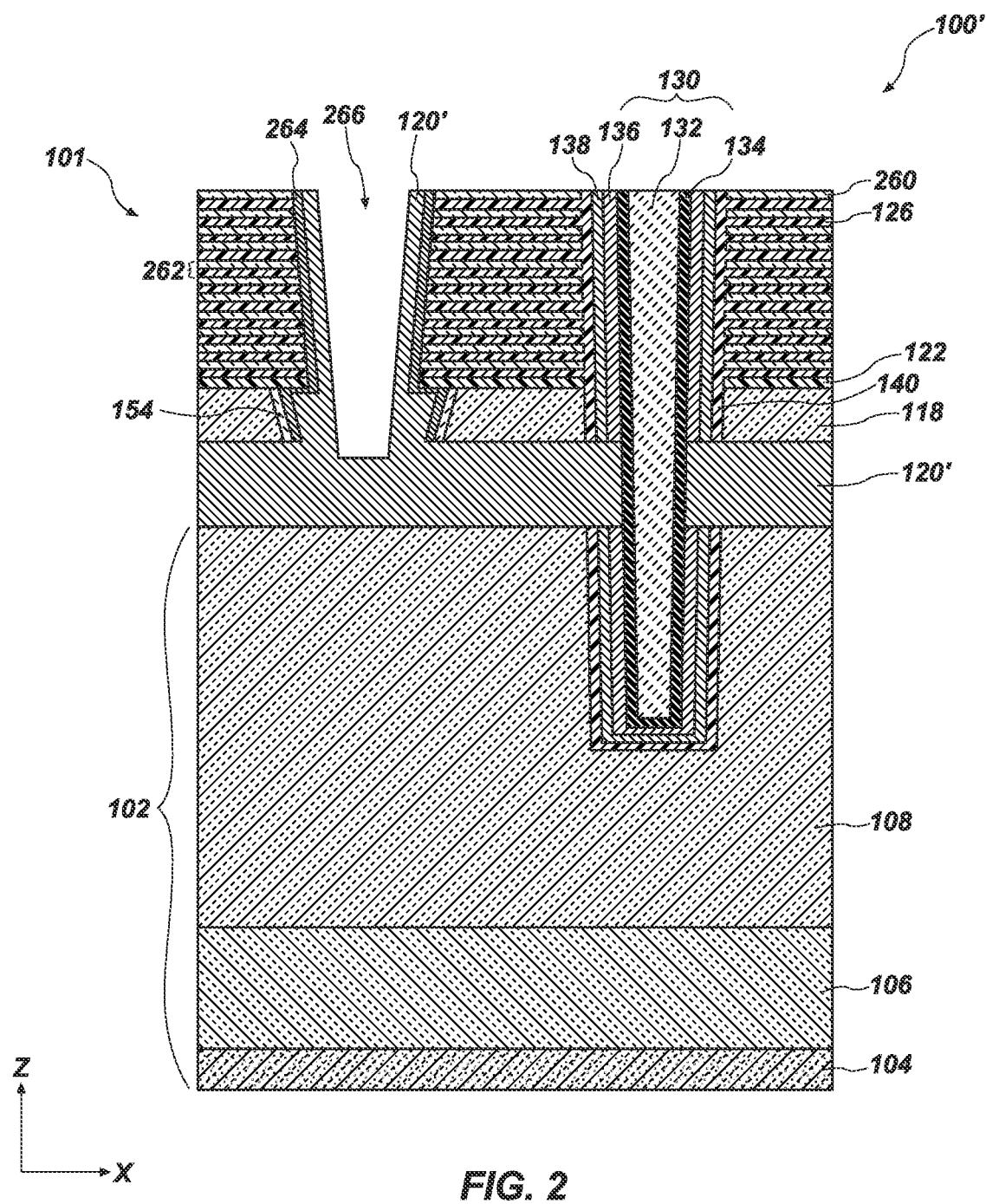
FIGS. 2-6B are simplified partial cross-sectional views illustrating a method of forming electronic devices in accordance with embodiments of the disclosure.

As shown in FIG. 2, the electronic device structure 100' including the conductive material 104, the source material 106, and the doped semiconductive material 108 are formed adjacent to the base material (not shown). A source contact sacrificial structure (not shown) may be formed adjacent to the source stack 102 at a location where the source contact 120 is ultimately to be formed. The source contact sacrificial structure is used to form the source contact 120 in a desired location and to provide lateral access between the source contact 120 and the pillars 130. The doped dielectric material 118 may be formed adjacent to the source contact sacrificial structure, and the dielectric cap material 122 may be formed adjacent to the doped dielectric material 118. Tiers 262 of alternating dielectric materials 126 and nitride materials 260 are formed adjacent to (e.g., vertically adjacent to, on) the dielectric cap material 122, with locations of the nitride materials 260 corresponding to subsequent locations of the conductive materials 128 (see FIG. 1) of the tiers 145. The pillars 130 may be formed in the electronic device structure 100', extending through the tiers 262, the dielectric cap material 122, the doped dielectric material 118 and the source contact sacrificial structure, and into the doped semiconductive material 108. The electronic device structure 100' in FIG. 2 may be formed by conventional techniques, which are not described in detail herein.

The slit 266 (shown partially filled in FIG. 2) is formed laterally adjacent to the pillars 130 and extends through the tiers 262, the dielectric cap material 122, and the doped dielectric material 118 and partially into the source contact sacrificial structure (not shown). The slit 266 is defined by sidewalls of the tiers 262, sidewalls of the dielectric cap material 122, sidewalls of the doped dielectric material 118, and an exposed upper surface of the source contact sacrificial structure. The slit 266 provides an opening through which materials are removed and provided to form the source contact 120 that is electrically coupled to the pillars 130.

The slit liner 154 is formed on the doped dielectric material 118, and a tier liner 264 is formed on the tiers 262 and on the slit liner 154. The tier liner 264 partially fills the slit 266. The slit liner 154 and the tier liner 264 may be formed by conventional techniques, such as by one or more conformal deposition processes. The material compositions of the slit liner 154 and the tier liner 264 may be selectively etchable relative to one another. The material composition of the tier liner 264 may also be selectively etchable relative to the material composition of the source seal 156. By way of example only, the slit liner 154 may be formed of silicon oxide and the tier liner 264 may be formed of polysilicon. However, the tier liner 264 may be a dielectric material, another semiconductive material, or a conductive material. The source contact sacrificial structure is subsequently removed through the slit 266 and replaced with a source contact material 120' by conventional techniques. The source contact material 120' is formed vertically adjacent to the doped semiconductive material 108 and substantially fills a lateral opening produced by the removal of the source contact sacrificial structure. The source contact material 120' is also formed on the tier liner 264 in the slit 266. A portion of the slit 266 may remain open (e.g., unoccupied by material(s)).

Figure 3:
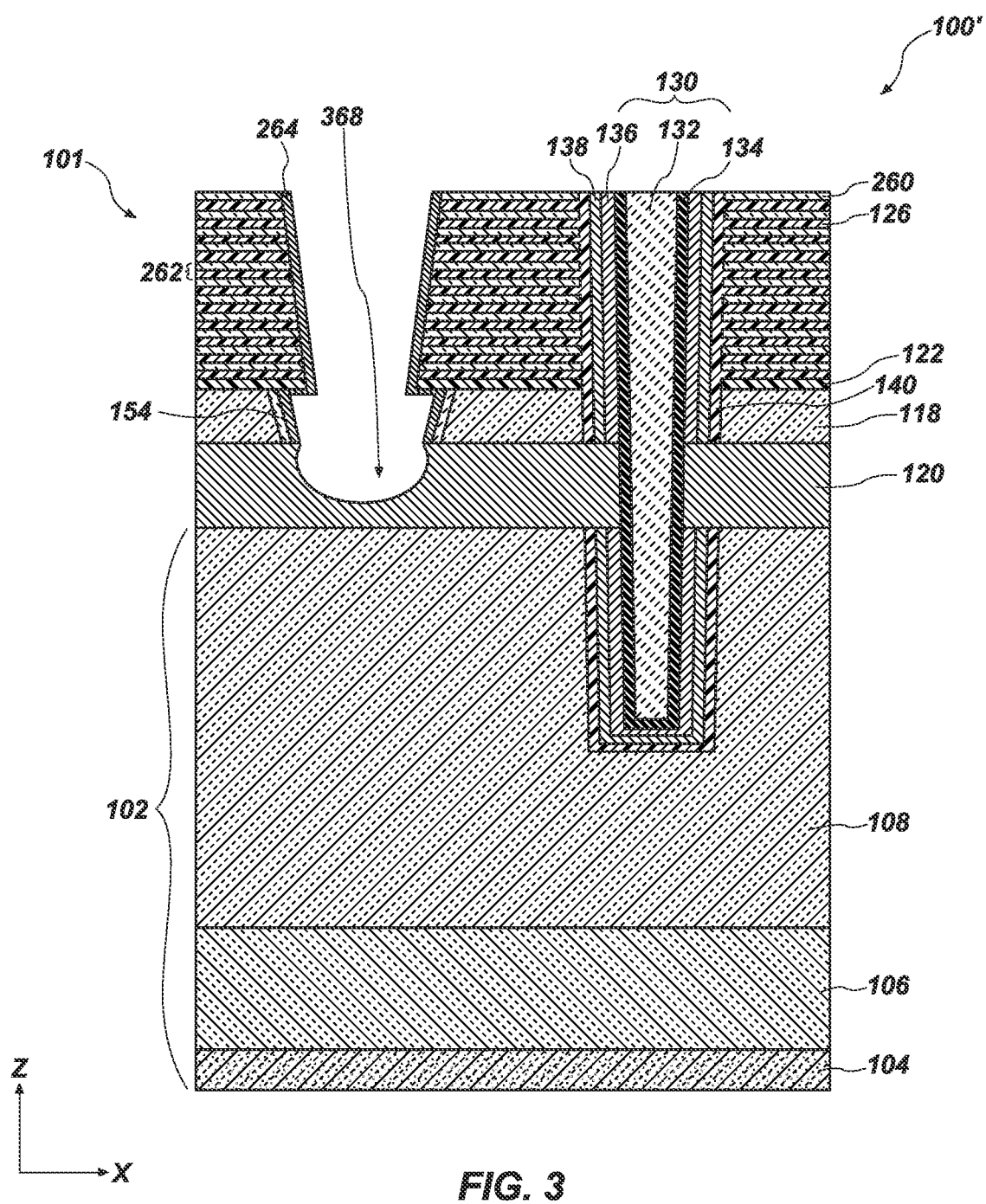

The source contact material 120' on the sidewalls of the tier liner 264 and a portion of the source contact material 120' exposed at the bottom of the slit 266 are removed, forming a recess 368 in the source contact material 120', as shown in FIG. 3. Removal of the source contact material 120' from the tier liner 264 forms the source contact 120 in the lateral opening. The source contact material 120' may be removed, for example, by a wet etch process. The wet etch process may remove portions of the source contact material 120' in lateral and vertical directions, forming the recess 368 below the slit 266. While the recess 368 in the source contact 120 is shown as having an elliptical cross-sectional shape, the cross-sectional shape may differ depending on the etch conditions (e.g., etch chemistry, temperature, pressure) used. For instance, the recess 368 may have a circular or other cross-sectional shape by changing the etch conditions. Dimensions (e.g., a depth, a width, and a length) of the recess 368 may be sufficient to form the source seal 156 at a desired thickness over the exposed, recessed portion of the source contact 120.

Figure 4:
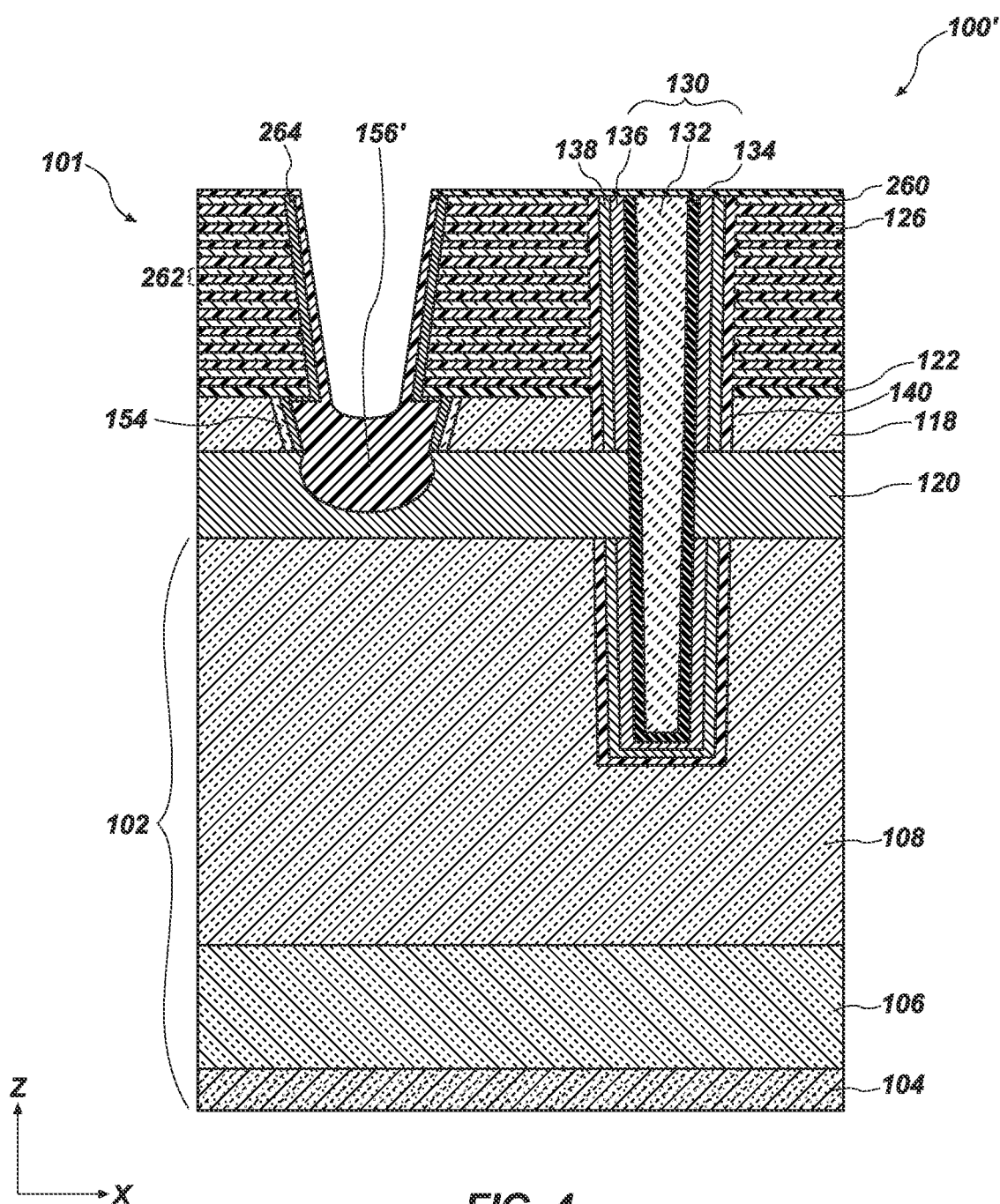

A source seal material 156' may be formed in the recess 368 and on the sidewalls of the tier liner 264, as shown in FIG. 4. The source seal material 156' may be formed by the bottom-up process, such as the bottom-up ALD process. The source seal material 156' is formed at a faster rate at the bottom of the recess 368 than on the sidewalls of the tier liner 264 such that the source seal material 156' preferentially forms in the recess 368 before forming on the sidewalls of the tier liner 264. The source seal material 156' may substantially completely fill the recess 368 and at least a portion of the slit 266. The source seal material 156' may also form on an upper surface of the tiers 262, which is not shown in FIG. 4 for simplicity. The bottom-up ALD process forms a relatively greater amount of the source seal material 156' in the recess 368 than the amount on the sidewalls of the tier liner 264 and over the tiers 262 by conducting sequential deposition and etch acts. While FIG. 4 shows a thin, source seal material 156' on the tier liner 264, the source seal material 156' may be relatively thicker on the tier liner 264 after initially forming the source seal material 156', with portions removed from the tier liner 264 by subsequently conducted etch acts. Alternatively, inhibitor compounds may be introduced to the slit 266 to reduce the amount of the source seal material 156' formed on the sidewalls of the tier liner 264. By conformally forming the source seal material 156', no seam (e.g., interface) of the source seal material 156' forms within the slit 266 or within the recess 368. Therefore, the electronic device 100 including the source seal 156 according to embodiments of the disclosure is less susceptible to damage during subsequently conducted process acts than if a seam were present, such as in a conventional electronic device.

Figure 5:
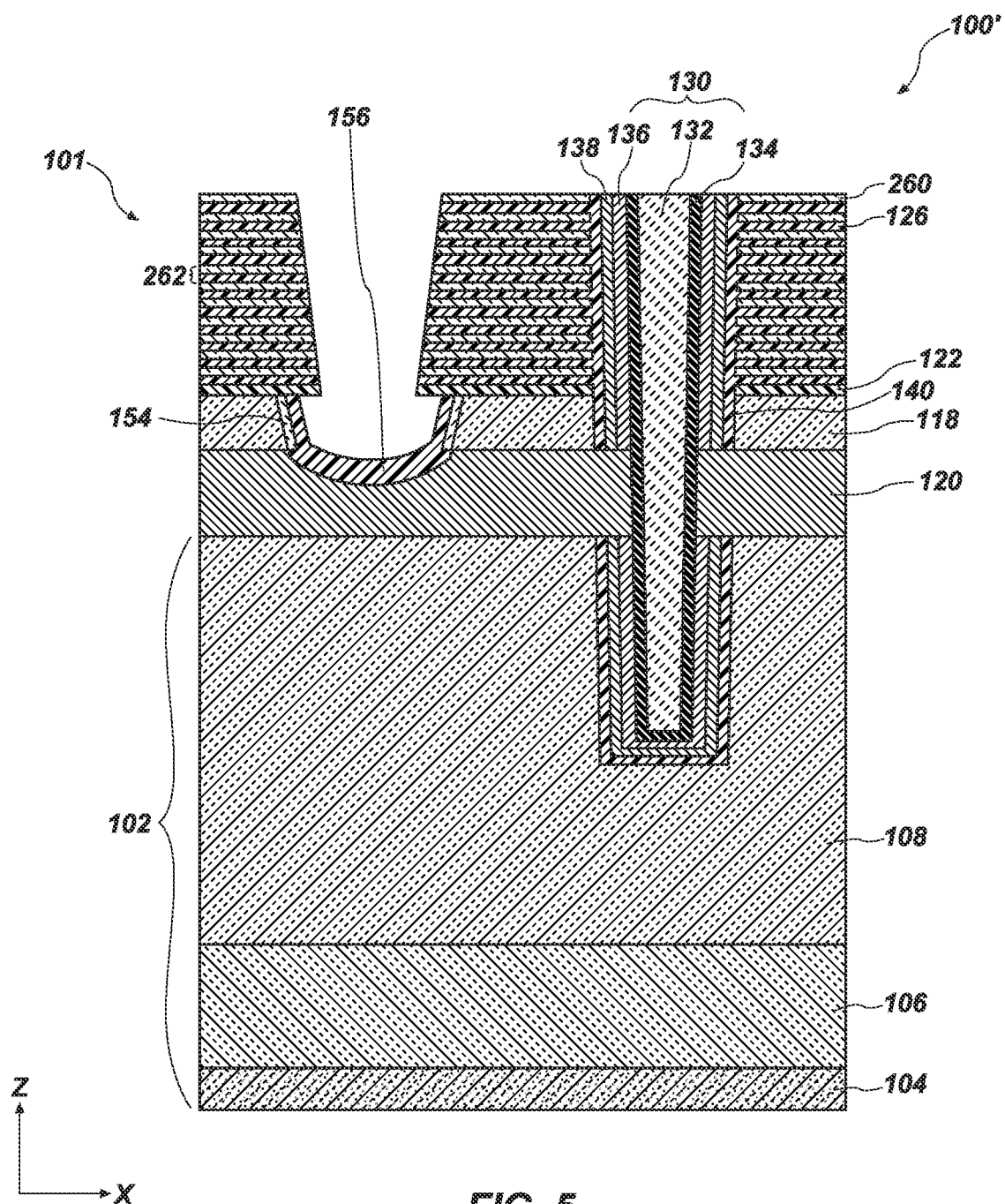

The source seal material 156' may be substantially removed from the tier liner 264 and the upper surface of the tiers 262, as shown in FIG. 5. However, at least a portion of the source seal material 156' remains in the recess 368 and the slit 266, producing the source seal 156. While some of the source seal material 156' may be removed from the recess 368, a sufficient amount remains to continuously cover the source contact 120 and the slit liner 154 (if present). The removal may be conducted by a wet etch process, such as a vapor etch process, depending on the material composition of the source seal material 156'. To maintain etch rate uniformity, the source seal material 156' may be removed, for example, by a vapor etch process conducted at a low temperature. The vapor etch process may be conducted at a temperature of from about 0° C. to about 500° C. The etch conditions for removing the portion of the source seal material 156' may be selected depending on the material compositions of the exposed materials. The etch conditions may remove the portion of the source seal material 156' from the slit 266 and the recess 368, without removing the tier liner 264 from the slit 266 and the recess 368. For instance, if the source seal material 156' is silicon oxide, aluminum oxide, or hafnium oxide, the desired portion may be removed using a hydrogen fluoride (HF) etch chemistry or a buffered oxide etch (BOE) etch chemistry in the vapor etch process. The HF etch chemistry may be an aqueous HF solution including HF at a concentration of between about 1:10 and about 1:1000. By adjusting the concentration of the etch chemistry and the process conditions (temperature, flow rates, etc.) of the vapor etch process, the source seal 156 may be formed to the desired thickness in the recess 368. The remaining thickness of the source seal 156 may be sufficient to prevent removal of, or damage to, the underlying source contact 120 and other materials during subsequent process acts, such as the removal of the tier liner 264. The thickness may range from about 10 nm to about 150 nm, such as from about 10 nm to about 100 nm. The source seal 156 may extend substantially continuously over the surface of the source contact 120 such that no or few voids (e.g., pinholes) are present.

Figure 6A:
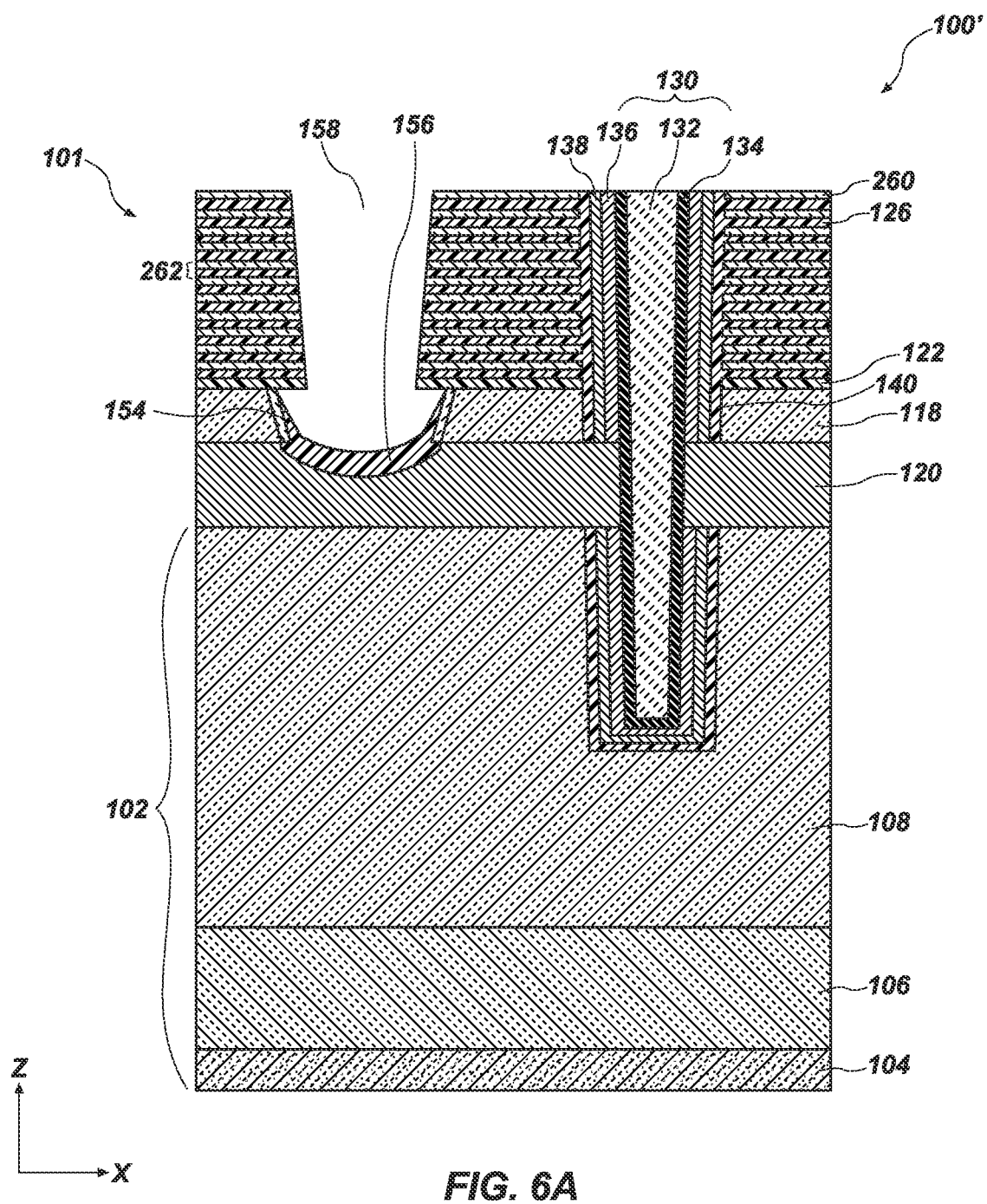

The tier liner 264 is then removed, exposing the tiers 262, the dielectric cap material 122, and the slit liner 154, as shown in FIG. 6A. The tier liner 264 is removed by conventional techniques. Since the slit liner 154 and the source seal 156 substantially continuously extend over the doped dielectric material 118 and the source contact 120, such as over the sidewalls of the doped dielectric material 118 and the recessed surface of the source contact 120, the tier liner 264 may be removed without removing a portion of (e.g., damaging) the source contact 120. The presence of the source seal 156 in the electronic device structure 100' according to embodiments of the disclosure enables the removal process to be conducted for a longer amount of time than a removal process for removing the tier liner in a conventional electronic device (i.e., an electronic device lacking a source seal). The tier liner 264 may be substantially completely removed from the tiers 262 before conducting the replacement gate process, which increases the degree of replacement of the nitride materials 260 by the conductive materials 128.

The slit liner 154 and the source seal 156 form a substantially continuous material that is configured to protect the doped dielectric material 118 and the source contact 120 during subsequent process acts. The slit liner 154 and the source seal 156 are substantially free of voids (e.g., pinholes), providing substantially continuous protection to the doped dielectric material 118, the source contact 120, and underlying materials. Since the source contact 120 is protected by the slit liner 154 and the source seal 156, the tier liner 264 may be substantially removed from the sidewalls of the tiers 262 without damaging the source contact 120 and underlying materials. The lack of a seam (e.g., interface) in the source seal 156 also contributes to the efficacy of the source seal 156 during the tier liner 264 removal process. In contrast, the source contact of conventional electronic devices are damaged during complete removal of the tier liner, which leads to block collapse in the conventional electronic devices.

Figure 6B:
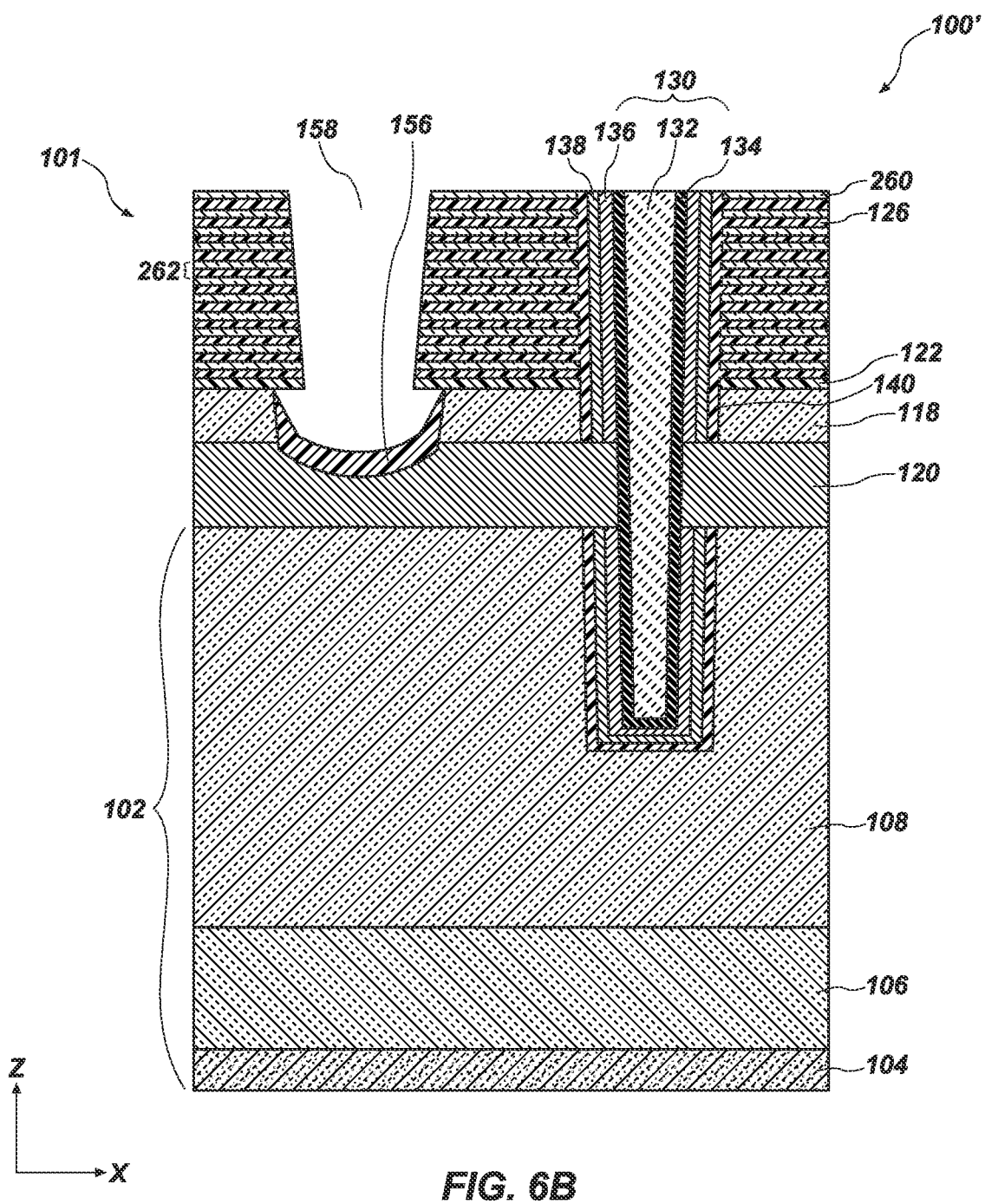

While FIG. 6A shows the source seal 156 on sidewalls of the slit liner 154, the source seal 156 may, alternatively, be formed directly on the doped dielectric material 118, as shown in FIG. 6B. The source seal 156' may be formed on sidewalls of the doped dielectric material 118 and on the recessed surface of the source contact 120. The tier liner 264 and the slit liner 154 may be removed following the stage of the fabrication process shown in FIG. 3. The source seal 156' may then be formed on the sidewalls of the tiers 262 and the sidewalls of the doped dielectric material 118. The tier liner 264 is removed, exposing the tiers 262, the dielectric cap material 122, and the slit liner 154. The slit liner 154 is removed, exposing the doped dielectric material 118. The tier liner 264 and the slit liner 154 may be removed by conventional techniques. The source seal material 156' is formed at a faster rate at the bottom of the recess 368 than on sidewalls of the tiers 262 such that the source seal material 156' preferentially forms in the recess 368 (e.g., on an exposed surface of the source contact material 120' and on sidewalls of the doped dielectric material 118) before forming on the sidewalls of the tiers 262. The tier liner 264 and the slit liner 154 may be substantially completely removed from the tiers 262 and the doped dielectric material 118 before conducting the replacement gate process, which increases the degree of replacement of the nitride materials 260 by the conductive materials 128.

To form the electronic device 100, the electronic device structure 100' shown in FIGS. 6A and 6B may be subjected to subsequent process acts. The subsequent process acts are conducted by conventional techniques. The replacement gate process is conducted, in which the nitride materials 260 of the tiers 262 are removed and replaced with the conductive materials 128 of the tiers 145. The conductive materials 128 are formed in openings previously occupied by the nitride materials 260, forming the strings 174 of the memory cells 176. Since the source contact 120 and the doped dielectric material 118 are protected by the source seal 156, little or no damage may be caused to the source contact 120 and the doped dielectric material 118 during the replacement gate process. The nitride materials 260 of the tiers 262 may be substantially completely removed without damaging the source contact 120 and underlying materials. For example, little or no corrosion of the source contact 120 occurs during the replacement gate process. The slit fill material 158 may be formed in the remaining volume of the slit 266 and recess 368, substantially completely filling the slit 266 and recess 368. The slit fill material 158 may be formed of a dielectric material, a metal material, a combination of a dielectric material and silicon, or a combination of a dielectric material and a conductive material. The slit fill material 158 may include, but is not limited to, a silicon oxide material, a polysilicon material, silicon, germanium, silicon germanium (SiGe), or a metal. The slit fill material 158 may provide support within the electronic device 100. The slit fill material 158 may be in direct contact with the source seal 156, the tiers 145, and the dielectric cap material 122.

Accordingly, in some embodiments, a method of forming an electronic device comprises forming a dielectric material adjacent to a source contact. The dielectric material comprises a slit liner on sidewalls thereof. Tiers of alternating dielectric materials and nitride materials are formed adjacent to the dielectric material. Pillars are formed that extend through the tiers and into a source stack adjacent to the source contact. A slit is formed through the tiers and dielectric material to expose the source contact. The slit is laterally adjacent to the pillars. A tier liner is formed on the slit liner and the tiers of alternating dielectric materials and nitride materials. A recess is formed within the source contact and below the slit, and a source seal material is formed in the recess and in the slit. A portion of the source seal material is removed to form a source seal adjacent to the source contact. The nitride materials of the tiers are replaced with conductive materials and a slit fill material is formed adjacent to the source seal.

By including the source seal 156 in the electronic device 100 according to embodiments of the disclosure, the process margin for removing the nitride materials 260 of the tiers 262 without damaging the source contact 120 is increased. The increased process margin enables the nitride materials 260 to be substantially completely removed from the tiers 262, without leading to block collapse of the electronic device 100. Using the source seal 156 in methods according to embodiments of the disclosure may enable smaller electronic devices having higher aspect ratio features to be formed. The methods according to embodiments of the disclosure, which utilize the bottom-up deposition process for forming the source seal 156' and the low temperature, vapor etch process for removing portions of the source seal material 156' from the sidewalls of the tiers 262, may enable electronic devices having smaller slits, higher stacks, smaller blocks, or smaller die sizes to be formed.

One or more electronic devices 100 according to embodiments of the disclosure may be present in an electronic device, an electronic system, or a processor-based system. The electronic device, the electronic system, or the processor-based system may include additional components, which are formed by conventional techniques. The additional components may include, but are not limited to, staircase structures, interdeck structures, contacts, interconnects, data lines (e.g., bit lines), access lines (e.g., word lines), etc. The additional components may be formed during the fabrication of the electronic device 100 or after the electronic device 100 has been fabricated. By way of example only, one or more of the additional components may be formed before or after the cell films of the pillars 130 are formed, while other additional components may be formed after the electronic device 100 has been fabricated. The additional components may be present in locations of the electronic devices 100 that are not depicted in the perspectives of FIGS. 1A-6B.

Figure 7:
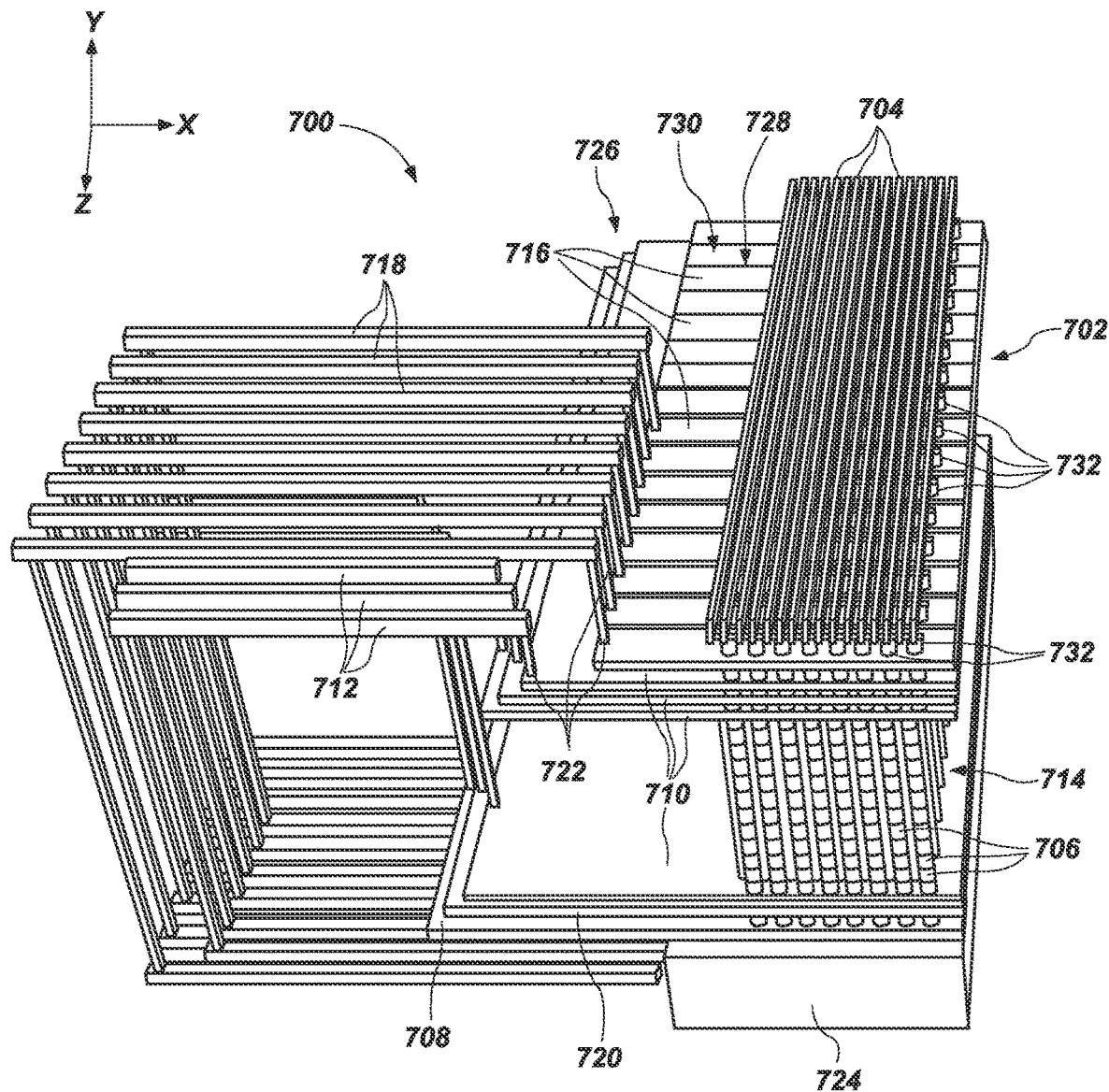
FIG. 7 is a partial cutaway perspective view of an electronic device in accordance with embodiments of the disclosure.

FIG. 7 illustrates a partial cutaway perspective view of a portion of an electronic device 700 (e.g., a microelectronic device, a memory device, such as a 3D NAND Flash memory device) including one or more electronic device structures 702 (e.g., a microelectronic device structure). The electronic device 700 may include one or more of the electronic devices 100 previously described with reference to FIGS. 1A through 6. As shown in FIG. 7, the electronic device structure 702 of the electronic device 700 may include a staircase structure 726 defining contact regions for connecting interconnect lines 712 to conductive structures 710 (e.g., corresponding to the conductive materials 128 (FIGS. 1A and 1B)). The electronic device structure 702 may include vertical strings 714 (e.g., corresponding to the strings 174 (FIG. 1B)) of memory cells 706 (e.g., corresponding to the memory cells 176 (FIG. 1B)) that are coupled to each other in series. The vertical strings 714 may extend vertically (e.g., in the Z-direction) and orthogonally to conductive lines and the conductive structures 710, such as the data lines 704, a source tier 708 (e.g., corresponding to the source stack 102 (FIG. 1B), the interconnect lines 712, first select gates 716 (e.g., upper select gates, drain select gates (SGDs)), select lines 718, and a second select gate 720 (e.g., a lower select gate, a select gate source (SGS) corresponding to the SGS 146 (FIG. 1B)). The select gates 716 may be horizontally divided (e.g., in the Y-direction) into multiple blocks 730 horizontally separated (e.g., in the Y-direction) from one another by slits 728.

Vertical conductive contacts 722 may electrically couple components to each other as shown. For example, the select lines 718 may be electrically coupled to the first select gates 716 and the interconnect lines 712 may be electrically coupled to the conductive structures 710. The electronic device 700 may also include a control unit 724 positioned under the memory array, which may include at least one of string driver circuitry, pass gates, circuitry for selecting gates, circuitry for selecting conductive lines (e.g., the data lines 704, the interconnect lines 712), circuitry for amplifying signals, and circuitry for sensing signals. The control unit 724 may be electrically coupled to the data lines 704, the source tier 708, the interconnect lines 712, the first select gates 716, and the second select gates 720, for example. In some embodiments, the control unit 724 includes CMOS (complementary metal-oxide-semiconductor) circuitry. In such embodiments, the control unit 724 may be characterized as having a "CMOS under Array" ("CuA") configuration.

The first select gates 716 may extend horizontally in a first direction (e.g., the X-direction) and may be coupled to respective first groups of vertical strings 714 of memory cells 706 at a first end (e.g., an upper end) of the vertical strings 714. The second select gate 720 may be formed in a substantially planar configuration and may be coupled to the vertical strings 714 at a second, opposite end (e.g., a lower end) of the vertical strings 714 of memory cells 706.

The data lines 704 (e.g., digit lines, bit lines) may extend horizontally in a second direction (e.g., in the Y-direction) that is at an angle (e.g., perpendicular) to the first direction in which the first select gates 716 extend. Individual data lines 704 may be coupled to individual groups of the vertical strings 714 extending the second direction (e.g., the Y-direction) at the first end (e.g., the upper end) of the vertical strings 714 of the individual groups. Additional individual groups of the vertical strings 714 extending the first direction (e.g., the X-direction) and coupled to individual first select gates 716 may share a particular vertical string 714 thereof with individual group of vertical strings 714 coupled to an individual data line 704. Thus, an individual vertical string 714 of memory cells 706 may be selected at an intersection of an individual first select gate 716 and an individual data line 704. Accordingly, the first select gates 716 may be used for selecting memory cells 706 of the vertical strings 714 of memory cells 706.

The conductive structures 710 (e.g., word lines) may extend in respective horizontal planes. The conductive structures 710 may be stacked vertically, such that each conductive structure 710 is coupled to at least some of the vertical strings 714 of memory cells 706, and the vertical strings 714 of the memory cells 706 extend vertically through the stack structure including the conductive structures 710. The conductive structures 710 may be coupled to or may form control gates of the memory cells 706.

The first select gates 716 and the second select gates 720 may operate to select a vertical string 714 of the memory cells 706 interposed between the data lines 704 and the source tier 708. Thus, an individual memory cell 706 may be selected and electrically coupled to a data line 704 by operation of (e.g., by selecting) the appropriate first select gate 716, second select gate 720, and conductive structure 710 that are coupled to the particular memory cell 706.

The staircase structure 726 may be configured to provide electrical connection between the interconnect lines 712 and the conductive structures 710 through the vertical conductive contacts 722. In other words, an individual conductive structure 710 may be selected via an interconnect line 712 in electrical communication with a respective vertical conductive contact 722 in electrical communication with the conductive structure 710. The data lines 704 may be electrically coupled to the vertical strings 714 through conductive contact structures 732.

Figure 8:
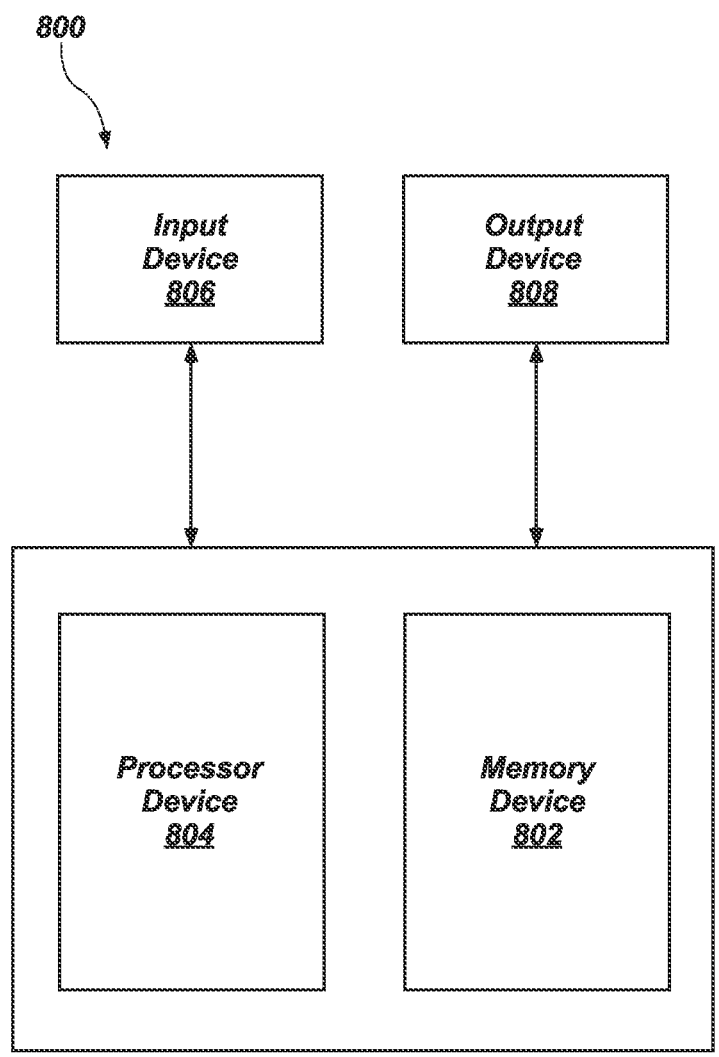
FIG. 8 is a block diagram of an electronic system in accordance with embodiments of the disclosure.

Electronic devices 100 according to embodiments of the disclosure may be used in embodiments of electronic systems of the disclosure. For example, FIG. 8 is a block diagram of an electronic system 800, in accordance with embodiments of the disclosure. The electronic system 800 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 800 includes at least one memory device 802. The memory device 802 may include, for example, the electronic devices 100 previously described with reference to FIGS. 1A-6.

The electronic system 800 may further include at least one electronic signal processor device 804 (often referred to as a "microprocessor"). The electronic signal processor device 804 may optionally include the electronic device 100 previously described with reference to FIGS. 1A-6. The electronic system 800 may further include one or more input devices 806 for inputting information into the electronic system 800 by a user, such as, for example, a mouse or other pointing device, a keyboard, a touchpad, a button, or a control panel. The electronic system 800 may further include one or more output devices 808 for outputting information (e.g., visual or audio output) to a user such as, for example, a monitor, a display, a printer, an audio output jack, a speaker, etc. In some embodiments, the input device 806 and the output device 808 may comprise a single touchscreen device that can be used both to input information to the electronic system 800 and to output visual information to a user. The input device 806 and the output device 808 may communicate electrically with one or more of the memory device 802 and the electronic signal processor device 804.

Figure 9:
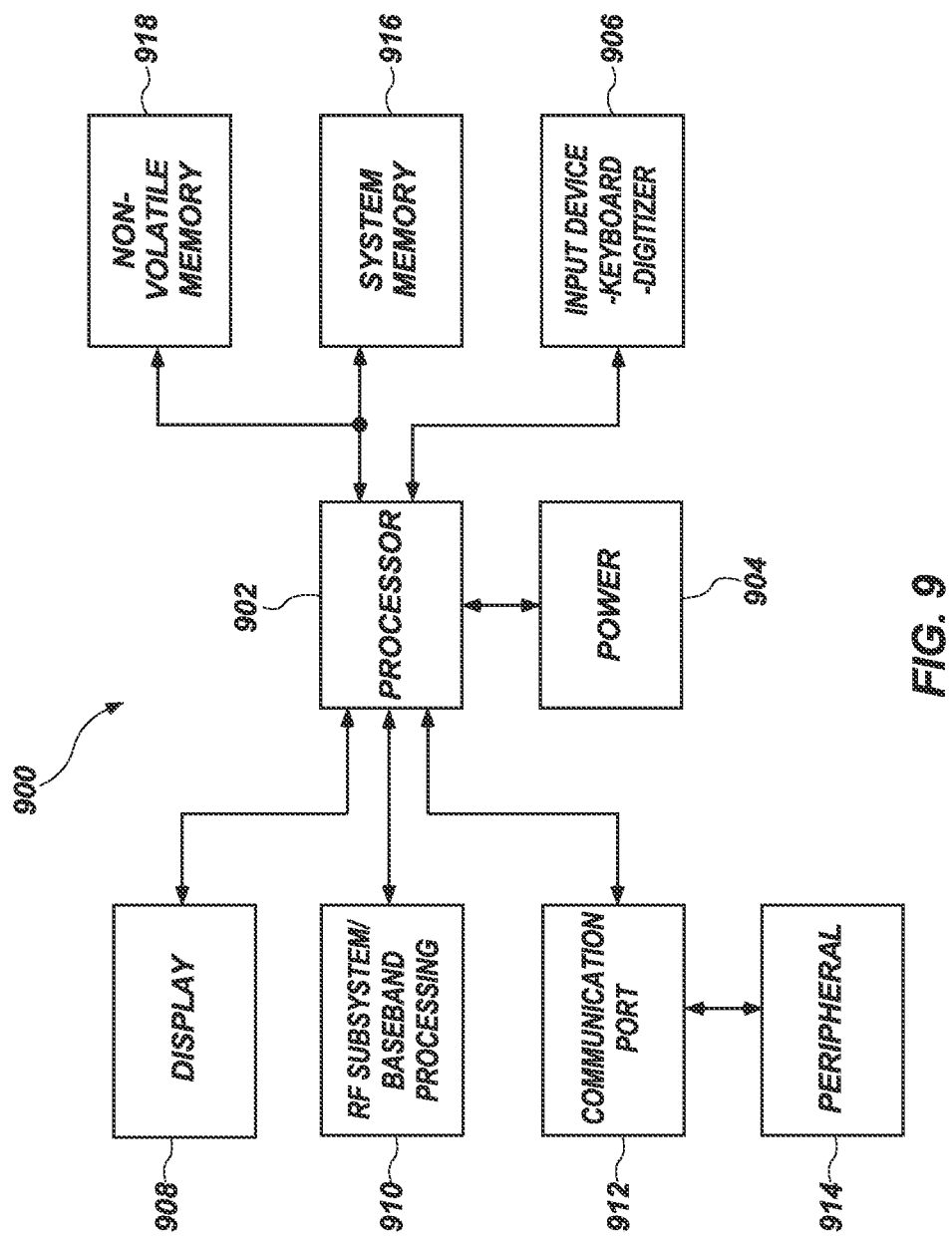
FIG. 9 is a block diagram of a processor-based system in accordance with embodiments of the disclosure.

With reference to FIG. 9, depicted is a processor-based system 900. The processor-based system 900 may include various electronic devices (e.g., the electronic devices 100) manufactured in accordance with embodiments of the disclosure. The processor-based system 900 may be any of a variety of types such as a computer, pager, cellular phone, personal organizer, control circuit, or other electronic device. The processor-based system 900 may include one or more processors 902, such as a microprocessor, to control the processing of system functions and requests in the processor-based system 900. The processor 902 and other subcomponents of the processor-based system 900 may include electronic devices (e.g., the electronic devices 100) manufactured in accordance with embodiments of the disclosure.

The processor-based system 900 may include a power supply 904 in operable communication with the processor 902. For example, if the processor-based system 900 is a portable system, the power supply 904 may include one or more of a fuel cell, a power scavenging device, permanent batteries, replaceable batteries, and rechargeable batteries. The power supply 904 may also include an AC adapter; therefore, the processor-based system 900 may be plugged into a wall outlet, for example. The power supply 904 may also include a DC adapter such that the processor-based system 900 may be plugged into a vehicle cigarette lighter or a vehicle power port, for example.

Various other devices may be coupled to the processor 902 depending on the functions that the processor-based system 900 performs. For example, a user interface 906 may be coupled to the processor 902. The user interface 906 may include input devices such as buttons, switches, a keyboard, a light pen, a mouse, a digitizer and stylus, a touch screen, a voice recognition system, a microphone, or a combination thereof. A display 908 may also be coupled to the processor 902. The display 908 may include an LCD display, an SED display, a CRT display, a DLP display, a plasma display, an OLED display, an LED display, a three-dimensional projection, an audio display, or a combination thereof. Furthermore, an RF sub-system/baseband processor 910 may also be coupled to the processor 902. The RF sub-system/baseband processor 910 may include an antenna that is coupled to an RF receiver and to an RF transmitter (not shown). A communication port 912, or more than one communication port 912, may also be coupled to the processor 902. The communication port 912 may be adapted to be coupled to one or more peripheral devices 914, such as a modem, a printer, a computer, a scanner, or a camera, or to a network, such as a local area network, remote area network, intranet, or the Internet, for example.

The processor 902 may control the processor-based system 900 by implementing software programs stored in the memory. The software programs may include an operating system, database software, drafting software, word processing software, media editing software, or media playing software, for example. The memory is operably coupled to the processor 902 to store and facilitate execution of various programs. For example, the processor 902 may be coupled to system memory 916, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 916 may include volatile memory, non-volatile memory, or a combination thereof. The system memory 916 is typically large so that it can store dynamically loaded applications and data. In some embodiments, the system memory 916 may include semiconductor devices, such as the electronic devices 100 described above.

The processor 902 may also be coupled to non-volatile memory 918, which is not to suggest that system memory 916 is necessarily volatile. The non-volatile memory 918 may include one or more of STT-MRAM, MRAM, read-only memory (ROM) such as an EPROM, resistive read-only memory (RROM), and flash memory to be used in conjunction with the system memory 916. The size of the non-volatile memory 918 is typically selected to be just large enough to store any necessary operating system, application programs, and fixed data. Additionally, the non-volatile memory 918 may include a high-capacity memory such as disk drive memory, such as a hybrid-drive including resistive memory or other types of non-volatile solid-state memory, for example. The non-volatile memory 918 may include electronic devices, such as the electronic devices 100 described above.

Accordingly, in some embodiments, an electronic system comprises a processor operably coupled to an input device and an output device and one or more electronic devices operably coupled to the processor. The one or more electronic devices comprise strings of memory cells extending vertically through a tier stack comprising alternating dielectric materials and conductive materials. A source contact is vertically adjacent to the tier stack and a source seal is on a recessed portion of the source contact proximal to the tier stack. The source contact is electrically coupled to the strings of memory cells. A source stack is below the source contact, the strings of memory cells extending vertically into the source stack.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An electronic device comprising:
    a source stack comprising one or more conductive materials;
    a source contact vertically adjacent to the source stack and extending laterally over the source stack, a source seal on a portion of the source contact;
    tiers of alternating conductive materials and dielectric materials adjacent to the source contact; and
    pillars extending through the tiers and the source contact and into the source stack, the pillars being electrically connected to the source contact.

2. The electronic device of claim 1, wherein the source seal extends substantially continuously over the portion of the source contact.

3. The electronic device of claim 1, wherein the source seal comprises a metal material or an oxide material.

4. The electronic device of claim 1, wherein an upper surface of the source seal is recessed relative to an upper surface of the source contact.

5. The electronic device of claim 1, further comprising a slit fill material adjacent to the source seal.

6. The electronic device of claim 5, wherein the source seal directly contacts the source contact and the slit fill material.

7. The electronic device of claim 1, wherein the source seal is laterally adjacent to the pillars.

8. An electronic device comprising:
    a source stack adjacent to a source contact, the source contact being laterally coextensive with the source stack;
    a tier stack comprising conductive materials and dielectric materials adjacent to the source stack;
    a source seal on a recessed portion of the source contact, the source seal configured as a continuous material on the recessed portion of the source contact; and
    pillars extending through the tier stack and the source contact and into the source stack, the pillars being electrically connected to the source contact.

9. The electronic device of claim 8, wherein an interface is present between the source seal and the source contact.

10. The electronic device of claim 8, further comprising a slit liner on a dielectric material between the source contact and the tier stack, the slit liner and the source seal comprising a substantially continuous material on the dielectric material and the source contact.

11. A method of forming an electronic device, comprising:
    forming a dielectric material adjacent to a laterally extending source contact, the dielectric material comprising a slit liner on sidewalls thereof;
    forming tiers of alternating dielectric materials and nitride materials adjacent to the dielectric material;
    forming pillars extending through the tiers and into a source stack adjacent to the laterally extending source contact, the pillars being electrically connected to the laterally extending source contact;

forming a slit through the tiers and the dielectric material to expose the laterally extending source contact, the slit laterally adjacent to the pillars;

forming a tier liner on the slit liner and the tiers of alternating dielectric materials and nitride materials;

forming a recess within the laterally extending source contact and below the slit;

forming a source seal material in the recess and in the slit;

removing a portion of the source seal material to form a source seal adjacent to the laterally extending source contact;

replacing the nitride materials of the tiers with conductive materials; and forming a slit fill material adjacent to the source seal.

12. The method of claim 11, wherein forming a recess within the laterally extending source contact and below the slit comprises removing a portion of the laterally extending source contact by a wet etch process.

13. The method of claim 11, wherein forming a source seal material in the recess and in the slit comprises forming the source seal in the recess and in the slit by a bottom-up, atomic layer deposition process.

14. The method of claim 11, wherein removing a portion of the source seal material to form a source seal comprises forming the source seal continuously extending over the laterally extending source contact below the slit.

15. The method of claim 11, wherein removing a portion of the source seal material comprises removing the portion of the source seal material using a wet etch process.

16. The method of claim 11, further comprising removing the tier liner without substantially removing the source seal.

17. The method of claim 16, wherein removing the tier liner without substantially removing the source seal comprises removing the tier liner using a vapor etch process.

18. The method of claim 16, wherein removing the tier liner without substantially removing the source seal comprises forming the slit liner and the source seal as a substantially continuous material over the dielectric material and the laterally extending source contact.

19. An electronic system, comprising:

a processor operably coupled to an input device and an output device; and one or more electronic devices operably coupled to the processor, the one or more electronic devices comprising:

strings of memory cells extending vertically through a tier stack comprising alternating dielectric materials and conductive materials;

a source contact vertically adjacent to the tier stack and extending laterally, a source seal on a recessed portion of the source contact proximal to the tier stack and the source contact electrically coupled to the strings of memory cells; and a source stack below the source contact, the strings of memory cells extending vertically into the source stack.

20. The electronic system of claim 19, wherein the source seal extends continuously on the recessed portion of the source contact.

* * * * *